(12) United States Patent
Chang et al.

(10) Patent No.: US 10,256,312 B1
(45) Date of Patent: Apr. 9, 2019

(54) SEMICONDUCTOR STRUCTURE WITH A GAP BETWEEN CONDUCTOR FEATURES AND FABRICATION METHOD THEREOF

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW); Yi-Ching Chang, Pingtung County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/886,812

(22) Filed: Feb. 1, 2018

(30) Foreign Application Priority Data

Jan. 25, 2018 (CN) .......................... 2018 1 0072080

(51) Int. Cl.
| | |
|---|---|
| *H01L 29/423* | (2006.01) |
| *H01L 21/768* | (2006.01) |
| *H01L 23/528* | (2006.01) |
| *H01L 29/66* | (2006.01) |
| *H01L 23/522* | (2006.01) |
| *H01L 23/532* | (2006.01) |
| *H01L 23/00* | (2006.01) |
| *H01L 23/31* | (2006.01) |

(52) U.S. Cl.
CPC .... *H01L 29/4236* (2013.01); *H01L 21/76829* (2013.01); *H01L 21/76837* (2013.01); *H01L 21/76873* (2013.01); *H01L 21/76885* (2013.01); *H01L 23/3171* (2013.01); *H01L 23/5223* (2013.01); *H01L 23/5227* (2013.01); *H01L 23/5228* (2013.01); *H01L 23/5283* (2013.01); *H01L 23/5329* (2013.01); *H01L 24/05* (2013.01); *H01L 24/13* (2013.01); *H01L 29/66621* (2013.01)

(58) Field of Classification Search
CPC ........... H01L 29/4236; H01L 29/66621; H01L 29/66636; H01L 23/5329; H01L 23/3171; H01L 23/5223; H01L 21/76885; H01L 21/76837; H01L 21/76838; H01L 21/76829; H01L 21/76843; H01L 21/76877; H01L 21/76879; H01L 21/76897
See application file for complete search history.

(56) References Cited

U.S. PATENT DOCUMENTS

| | | |
|---|---|---|
| 8,008,775 B2 | 8/2011 | Lin |
| 8,153,489 B2 | 4/2012 | Song |

(Continued)

*Primary Examiner* — Thanh Y Tran
(74) *Attorney, Agent, or Firm* — Winston Hsu (57) ABSTRACT

A semiconductor structure includes a contact plug located on a barrier layer in a contact hole; a first conductive feature integrally formed with the contact plug on the barrier layer; a second conductive feature disposed on the interlayer dielectric layer; and a gap between the first and second conductive features. The gap includes a vertical trench recessed into the interlayer dielectric layer, and a discontinuity in the barrier layer. The discontinuity extends below the second conductive feature to form an undercut structure.

21 Claims, 5 Drawing Sheets

(56) References Cited

U.S. PATENT DOCUMENTS 8,552,559 B2 10/2013 Lin
2005/0001253 A1* 1/2005 Sugimura ......... H01L 21/76804
257/296

* cited by examiner

SEMICONDUCTOR STRUCTURE WITH A GAP BETWEEN CONDUCTOR FEATURES AND FABRICATION METHOD THEREOF

BACKGROUND OF THE INVENTION

1. Field of the Invention

The present invention relates to the field of semiconductor technology, and more particularly to a semiconductor structure and a manufacturing method thereof.

2. Description of the Prior Art

As the line width of the memory process becomes smaller and smaller, when the M0 tungsten metal layer is patterned into a fine trace in a peripheral circuit or a core circuit, short-circuit problems between thin circuits are often encountered.

Therefore, there is still a need in the art for an improved semiconductor structure and fabrication method to overcome the shortcomings and disadvantages of the prior art.

SUMMARY OF THE INVENTION

It is one object of the present invention to provide an improved method of fabricating a semiconductor device which solves the deficiencies of the prior art.

According to one aspect of the invention, a semiconductor structure is provided. The semiconductor structure includes a substrate having thereon a conductive region; an interlayer dielectric (ILD) layer covering the substrate; a contact hole in the ILD layer, wherein the contact hole partially exposes the conductive region; a barrier layer conformally lining interior surface of the contact hole and a top surface of the ILD layer; a contact plug in the contact hole and on the barrier layer; a first conductor feature integrally constructed on the contact plug; a second conductor feature disposed on the top surface of the ILD layer, wherein the second conductor feature is in close proximity to the first conductor feature; and a gap between the first conductor feature and the second conductor feature, wherein the gap comprises a vertical trench recessed into the ILD layer and a discontinuity in the barrier layer, wherein the discontinuity creates an undercut directly under the second conductor feature.

According to another aspect of the invention, a method for fabricating a semiconductor structure is disclosed. A substrate having thereon a conductive region and an interlayer dielectric (ILD) layer covering the substrate and the conductive region is provided. A contact hole is formed in the ILD layer, wherein the contact hole partially exposes the conductive region. A barrier layer is deposited for conformally lining interior surface of the contact hole and a top surface of the ILD layer. A conductive layer is deposited on the barrier layer, wherein the contact hole is filled with the conductive layer so as to form a contact plug therein. A lithographic process and an anisotropic process are performed to etch the conductive layer, the barrier layer and the ILD layer so as to form a first conductor feature integrally constructed on the contact plug and a second conductor feature disposed on the top surface of the ILD layer, wherein the second conductor feature is in close proximity to the first conductor feature. A selective etching process is performed to selectively etch the barrier layer thereby forming a gap between the first conductor feature and the second conductor feature, wherein the gap comprises a vertical trench recessed into the ILD layer and a discontinuity in the barrier layer, wherein the discontinuity creates an undercut directly under the second conductor feature.

These and other objectives of the present invention will no doubt become obvious to those of ordinary skill in the art after reading the following detailed description of the preferred embodiment that is illustrated in the various figures and drawings.

DETAILED DESCRIPTION

In the following, the details will be described with reference to the drawings, the contents of which also form part of the description of the specification and are illustrated in the specific examples in which the embodiment can be practiced. The following examples have described sufficient details to enable those of ordinary skill in the art to practice this invention.

Of course, other embodiments may be adopted, or any structural, logical, and electrical changes may be made without departing from the embodiments described herein. Therefore, the following detailed description is not to be taken in a limiting sense, and the examples contained therein are to be defined by the appended claims.

Figure 1:
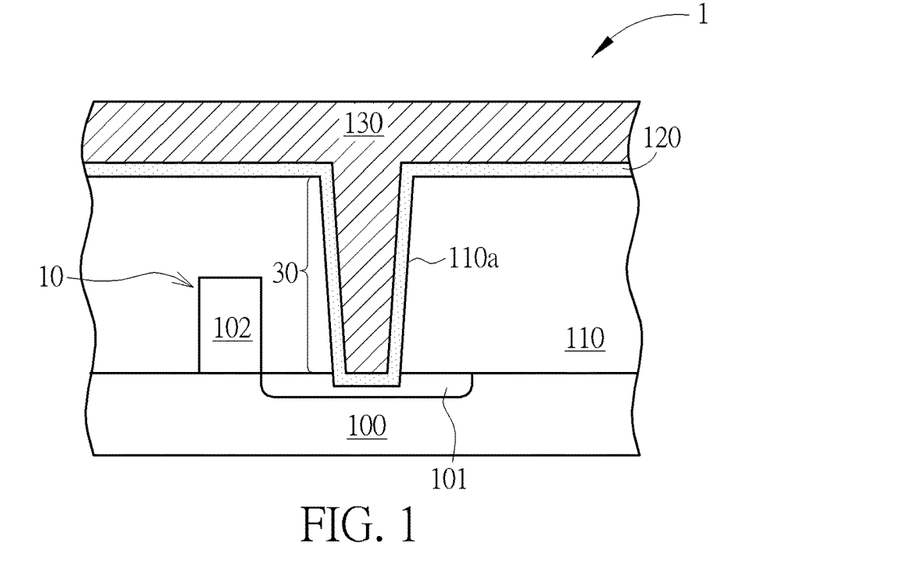
FIG. 1 to FIG. 5 are schematic, cross-sectional diagrams showing a method for fabricating a semiconductor structure according to an embodiment of the present invention.

Please refer to FIG. 1 to FIG. 5, which are schematic, cross-sectional diagrams showing a method for fabricating a semiconductor structure 1 according to an embodiment of the present invention. First, as shown in FIG. 1, a substrate 100, for example, a semiconductor substrate, is provided. The semiconductor substrate may include a silicon substrate, but is not limited thereto. According to an embodiment of the present invention, a field effect transistor 10 and an interlayer dielectric (ILD) layer 110 may be disposed on the substrate 100. The field effect transistor 10 may include a conductive region 101 and a gate structure 102. The interlayer dielectric layer 110 covers the substrate 100, the conductive region 101, and the gate structure 102. The conductive region 101 may be a source/drain doped region of the field effect transistor 10.

Next, a contact hole 110a is formed in the interlayer dielectric layer 110. The contact hole 110a exposes a portion of the conductive region 101. Then, a barrier layer 120 is deposited to conformally line the interior surface of the contact hole 110a. The barrier layer 120 also covers the top surface of the interlayer dielectric layer 110. Then, a conductive layer 130 is deposited on the barrier layer 120. The conductive layer 130 fills the contact hole 110a to form a contact plug 30.

According to an embodiment of the present invention, the barrier layer 120 may comprise titanium (Ti), titanium nitride (TiN), tantalum (Ta), tantalum nitride (TaN), tungsten nitride (WN), or a combination thereof. According to an embodiment of the present invention, the conductive layer 130 may be a metal interconnection layer, such as an M0 metal layer. According to an embodiment of the present invention, the M0 metal layer comprises tungsten.

Figure 2:
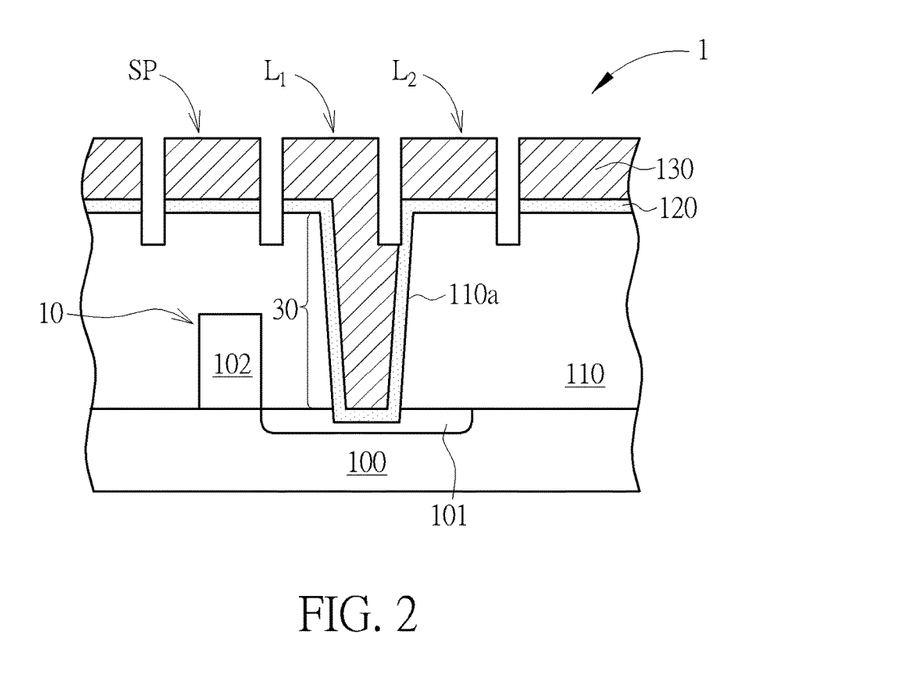

As shown in FIG. 2, a lithography process and an anisotropic etching process are performed to etch the conductive layer 130, the barrier layer 120 and the interlayer dielectric layer 110 to form a first conductive feature $L_1$, which is integrally constructed on the contact plug 30, and a second conductive feature $L_2$ on the top surface of the interlayer dielectric layer 110. The second conductive feature $L_2$ is in close proximity to the first conductive feature $L_1$. In addition, a storage node pad SP is formed on the interlayer dielectric layer 110. The first conductive feature $L_1$ and the second conductive feature $L_2$ are coplanar and are formed from the same level of metal interconnection.

According to an embodiment of the present invention, the first conductive feature $L_1$ and the second conductive feature $L_2$ are both a conductive circuit or trace structure, for example, a fine line in a memory peripheral circuit or a core circuit, but the present invention is not limited thereto. According to an embodiment of the present invention, at this point, the first conductive feature $L_1$ and the second conductive feature $L_2$ are still not completely separated from each other, and may be connected together via the barrier layer 120 that is not etched away at the upper corner of the contact hole 110a, which leads to short circuits between fine lines.

Figure 3:
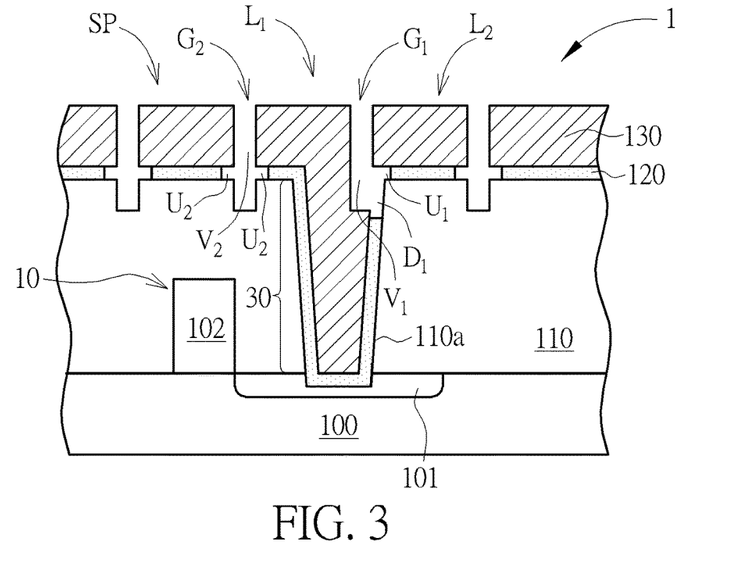

As shown in FIG. 3, in order to completely separate the first conductive feature $L_1$ and the second conductive feature $L_2$ from each other, a selective etching process is performed. For example, the selective etching process is performed to isotropically etch only the barrier layer 120. During the selective etching process, the conductive layer 130 is barely etched to form a gap $G_1$ between the first conductive feature $L_1$ and the second conductive feature $L_2$. The gap $G_1$ comprises a vertical trench $V_1$ recessed downward into the interlayer dielectric layer 110, and a discontinuity $D_1$ located in the barrier layer 120. The vertical trench $V_1$ is also recessed into an upper portion of the contact plug 30. The discontinuity $D_1$ is located at the upper corner of the contact hole 110a and extends under the second conductive feature $L_2$ to form an undercut structure $U_1$. The discontinuity $D_1$ reveals the interlayer dielectric layer 110 at the upper corner of the contact hole 110a.

It can be seen in FIG. 3 that there is also a gap $G_2$ between the first conductive feature $L_1$ and the storage node pad SP. The gap $G_2$ comprises a vertical trench $V_2$ recessed downward into the interlayer dielectric layer 110, and undercut structure $U_2$ formed by selectively etching the barrier layer 120 is produced. From the depicted cross-section, it can be seen that the gap $G_2$ presents a cross-shaped profile.

According to the embodiment of the present invention, the aforementioned selective etching process for etching only the barrier layer 120 may be performed by using a dry etching process, for example, using $Cl_2$ as an etching gas, in an ion bombardment mode, and under a temperature of less than 80° C. In addition, a soft etch process may be used in which the etching gas comprises (1) a fluorine-containing gas such as $F_2$, $XeF_2$ or $NF_3$, (2) a nitrogen and hydrogen containing gas such as $NH_3$, $N_2H_4$ or $N_2H_2$, (3) an oxygen-containing gas such as $O_2$, $O_3$ or $H_2O$. The aforementioned soft etching process can be performed at a temperature of about 250° C.

Figure 4:
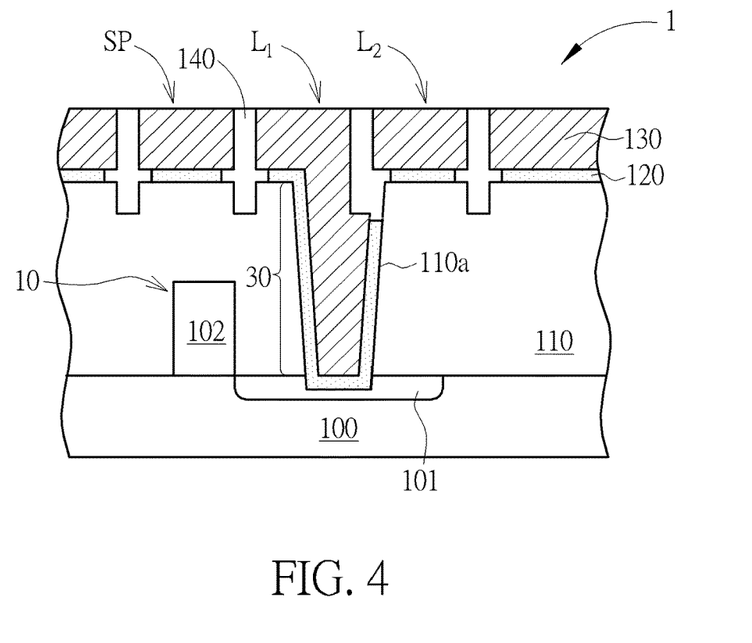

As shown in FIG. 4, a gap fill material layer 140 is deposited on the first conductive feature $L_1$ and the second conductive feature $L_2$, and the gap fill material layer 140 fills into the gap $G_1$ and the gap $G_2$. Subsequently, a chemical mechanical polishing (CMP) process may be performed to polish the gap fill material layer 140 such that the top surface of the gap fill material layer 140 is flush with the top surfaces of the first conductive feature $L_1$ and the second conductive feature $L_2$. The gap fill material layer 140 may comprise silicon nitride (SiN), but is not limited thereto.

Figure 6:
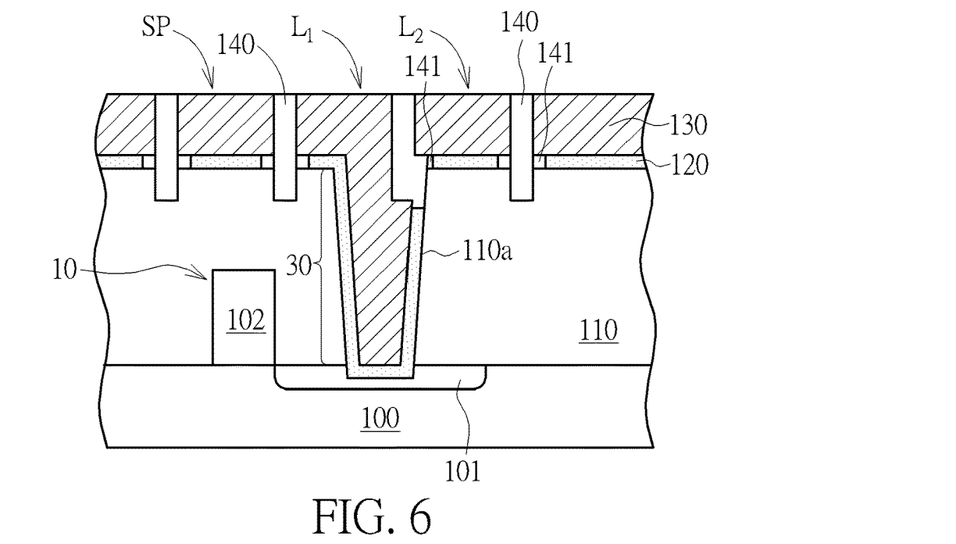
FIG. 6 is a schematic, cross-sectional view of a semiconductor structure according to another embodiment of the present invention, wherein a void is formed under the second conductive feature.

According to another embodiment of the present invention, the gap fill material layer 140 does not fill the undercut structure $U_1$ and the undercut structure $U_2$, and a void 141 may be formed under the second conductive feature $L_2$, as shown in FIG. 6.

Figure 5:
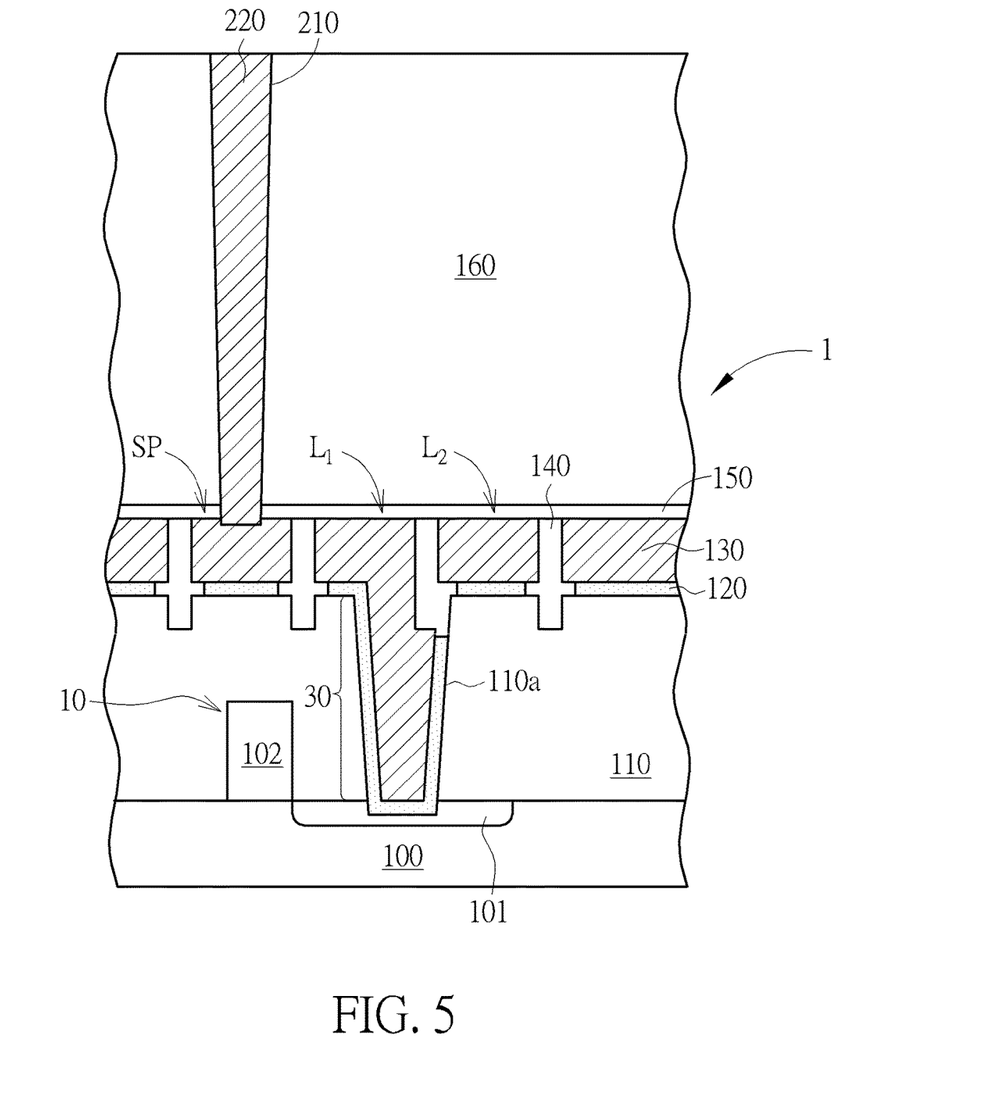

As shown in FIG. 5, after the chemical mechanical polishing process is completed, an etch stop layer 150 may be deposited on the top surface of the gap fill material layer 140 and the top surfaces of the first conductive feature $L_1$ and the second conductive feature $L_2$. For example, the etch stop layer 150 may be a silicon nitride layer, but is not limited thereto. Then, a dielectric layer 160, such as a silicon oxide layer, is deposited on the etch stop layer 150. According to the embodiment of the present invention, the dielectric layer 160 may be deposited after the capacitor structures in the memory array (not shown) are completed. Therefore, the thickness of the dielectric layer 160 may be higher than the height of the capacitor structures in the memory array. Subsequently, a contact hole 210 is formed in the dielectric layer 160 and the etch stop layer 150 through photolithography and etching processes to expose a portion of the top surface of the storage node pad SP. A contact plug 220 is then formed in the contact hole 210.

Structurally, as shown in FIG. 4, the semiconductor structure 1 of the present invention comprises a substrate 100, wherein the substrate 100 includes a conductive region 101, an interlayer dielectric layer 110 covering the substrate 100, a contact hole 110a disposed in the interlayer dielectric layer 110, wherein the contact hole 110a exposes a portion of the conductive region 101; a barrier layer 120 lining the interior surface of the contact hole 110a and covering the top surface of the interlayer dielectric layer 110; a contact plug 30 located in the contact hole 110a; a first conductive feature $L_1$ integrally constructed on the contact plug 30; a second conductive feature $L_2$ disposed on the top surface of the interlayer dielectric layer 110, wherein the second conductive feature $L_2$ is adjacent to the first conductive feature $L_1$; and a gap $G_1$ between the first conductive feature $L_1$ and the second conductive feature $L_2$. The gap $G_1$ includes a vertical trench $V_1$ recessed downwards to the upper part of the interlayer dielectric layer 110 and the contact plug 30, and discontinuity $D_1$ located in the barrier layer 120. The discontinuity $D_1$ extends below the second conductive feature $L_2$ to form the undercut structure $U_1$. The gap fill material layer 140 is located in the gap $G_1$, wherein the gap fill material layer 140 fills the vertical trench $V_1$ and the discontinuity $D_1$.

Figure 7:
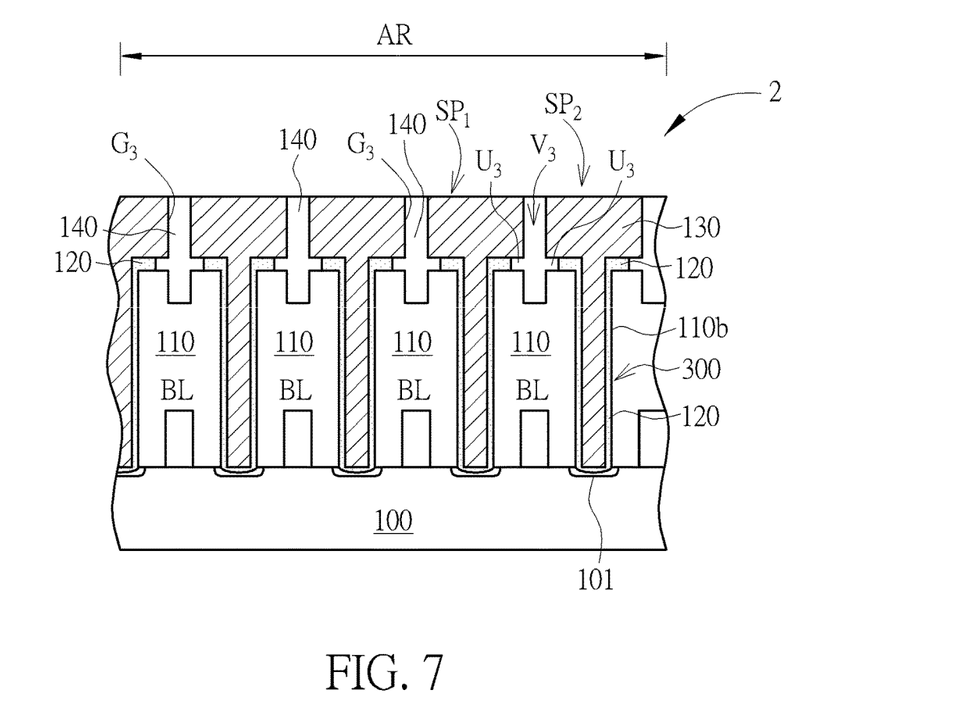
FIG. 7 to FIG. 9 are cross-sectional views of semiconductor structures according to other different embodiments of the present invention.
Figure 8:
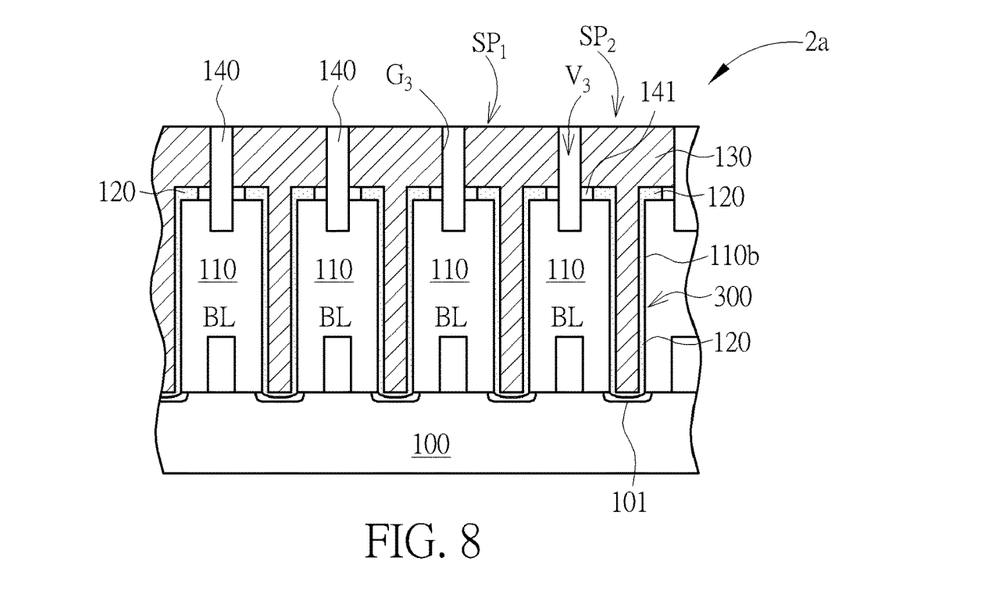
Figure 9:
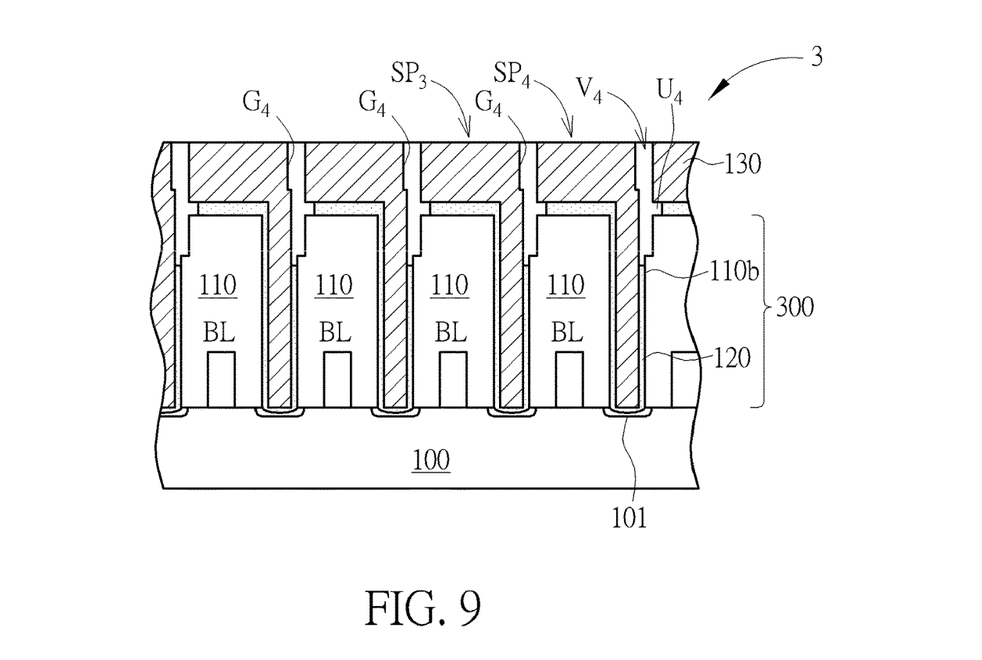

Please refer to FIG. 7 to FIG. 9, which are cross-sectional views of semiconductor structures according to other different embodiments of the present invention. The same or similar regions, layers or elements are denoted by the same reference numerals.

According to an embodiment of the present invention, as shown in FIG. 7, a semiconductor structure 2 may be a storage node pad structure in a memory array AR, which also includes a substrate 100. The substrate 100 includes a conductive region 101. A bit line BL is formed in the interlayer dielectric layer 110 on the substrate 100. A contact hole 110b is disposed in the interlayer dielectric layer 110 to expose a portion of the conductive region 101. The barrier layer 120 is deposited for lining the interior surface of the contact hole 110b. The barrier layer 120 also covers the top surface of the interlayer dielectric layer 110. The contact plug 300 is located in the contact hole 110b. The conductive features $SP_1$ and $SP_2$ are integrally constructed on the contact plugs 300, respectively. The gap $G_3$ is located between the conductive features $SP_1$ and $SP_2$. The gap $G_3$ includes a vertical trench $V_3$ recessed downwards to the interlayer dielectric layer 110, and an undercut structure $U_3$ under each of the conductive features $SP_1$ and $SP_2$. The gap fill material layer 140 is located in the gap $G_3$, wherein the gap fill material layer 140 fills the vertical trench $V_3$ and the undercut structures $U_3$. As can be seen from the section, the gap $G_3$ may have a cross-shaped pattern. FIG. 8 shows the semiconductor structure 2a in which the discontinuity $U_3$ is not filled with the gap fill material layer 140, so that the void 141 is left.

According to another embodiment of the present invention, as shown in FIG. 9, likewise, a semiconductor structure 3 is a storage node pad structure in the memory array AR. The difference between FIG. 9 and FIG. 7 is that the gap $G_4$ in FIG. 9 is not located at the symmetrical center between the conductive features $SP_1$ and $SP_2$, but rather to the side closer to the contact hole 110b. The semiconductor structure 3 likewise comprises a substrate 100, wherein the substrate 100 comprises a conductive area 101. A bit line BL is formed in the interlayer dielectric layer 110 on the substrate 100. A contact hole 110b is disposed in the interlayer dielectric layer 110 to expose a portion of the conductive region 101. The barrier layer 120 is deposited for lining the interior surface of the contact hole 110b. The barrier layer 120 also covers the top surface of the interlayer dielectric layer 110. The contact plug 300 is located in the contact hole 110b. The conductive features $SP_3$ and $SP_4$ are integrally constructed on the contact plugs 300, respectively. The gap $G_4$ is located between the conductive features $SP_3$ and $SP_4$. The gap $G_4$ includes a vertical trench $V_4$ recessed to the interlayer dielectric layer 110, and an undercut structure $U_4$ under the conductive structure $SP_4$. The gap fill material layer 140 is located in the gap $G_4$. The gap fill material layer 140 fills the vertical trench $V_4$ and the undercut structure $U_4$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate having thereon a conductive region;
    an interlayer dielectric (ILD) layer covering the substrate;
    a contact hole in the ILD layer, wherein the contact hole partially exposes the conductive region;
    a barrier layer conformally lining interior surface of the contact hole and a top surface of the ILD layer;
    a contact plug in the contact hole and on the barrier layer;
    a first conductor feature integrally constructed on the contact plug;
    a second conductor feature disposed on the top surface of the ILD layer, wherein the second conductor feature is in close proximity to the first conductor feature; and
    a gap between the first conductor feature and the second conductor feature, wherein the gap comprises a vertical trench recessed into the ILD layer and a discontinuity in the barrier layer, wherein the discontinuity creates an undercut directly under the second conductor feature, wherein the first conductor feature and the second conductor feature are coplanar and are formed from a same level of metal interconnection.

2. The semiconductor structure according to claim 1, wherein the vertical trench is recessed into an upper portion of the contact plug.

3. The semiconductor structure according to claim 1 further comprising:
    a gap fill material layer in the gap, wherein the gap fill material layer fills into the vertical trench and the discontinuity.

4. The semiconductor structure according to claim 3, wherein the undercut is not filled with the gap fill material layer so as to produce a void between the barrier layer and the gap fill material layer.

5. The semiconductor structure according to claim 3, wherein the gap fill material layer comprises silicon nitride.

6. The semiconductor structure according to claim 3, wherein a top surface of the gap fill material layer is flush with a top surface of the first conductor feature and a top surface of the second conductor feature.

7. The semiconductor structure according to claim 1, wherein the discontinuity in the barrier layer is disposed around an upper corner of the contact hole.

8. The semiconductor structure according to claim 7, wherein the discontinuity partially exposes the ILD layer at the upper corner of the contact hole.

9. The semiconductor structure according to claim 1, wherein the metal interconnection is M0 metal layer.

10. The semiconductor structure according to claim 9, wherein the M0 metal layer comprises tungsten.

11. The semiconductor structure according to claim 1, wherein the barrier layer comprises Ti, TiN, Ta, TaN, WN, or a combination thereof.

12. The semiconductor structure according to claim 1, wherein the conductive region is a source/drain doping region of a field effect transistor.

13. A method for fabricating a semiconductor structure, comprising:
    providing a substrate having thereon a conductive region and an interlayer dielectric (ILD) layer covering the substrate and the conductive region;
    forming a contact hole in the ILD layer, wherein the contact hole partially exposes the conductive region;
    forming a barrier layer conformally lining interior surface of the contact hole and a top surface of the ILD layer;
    depositing a conductive layer on the barrier layer, wherein the contact hole is filled with the conductive layer so as to form a contact plug therein;
    performing a lithographic process and an anisotropic process to etch the conductive layer, the barrier layer and the ILD layer so as to form a first conductor feature integrally constructed on the contact plug and a second conductor feature disposed on the top surface of the ILD layer, wherein the second conductor feature is in close proximity to the first conductor feature;
    performing a selective etching process to selectively etch the barrier layer thereby forming a gap between the first conductor feature and the second conductor feature, wherein the gap comprises a vertical trench recessed into the ILD layer and a discontinuity in the barrier layer, wherein the discontinuity creates an undercut directly under the second conductor feature;
    depositing a gap fill material layer on the first and second conductor features and into the gap; and
    polishing the gap fill material layer such that a top surface of the gap fill material layer is flush with a top surface of the first conductor feature and a top surface of the second conductor feature.

14. The method according to claim 13, wherein the gap fill material layer comprises silicon nitride.

15. The method according to claim 13, wherein the discontinuity in the barrier layer is disposed around an upper corner of the contact hole.

16. The method according to claim 15, wherein the discontinuity partially exposes the ILD layer at the upper corner of the contact hole.

17. The method according to claim 13, wherein the first conductor feature and the second conductor feature are coplanar and are formed from a same level of metal interconnection.

18. The method according to claim 17, wherein the metal interconnection is M0 metal layer.

19. The method according to claim 18, wherein the M0 metal layer comprises tungsten.

20. The method according to claim 13, wherein the barrier layer comprises Ti, TiN, Ta, TaN, WN, or a combination thereof.

21. The method according to claim 13, wherein the conductive region is a source/drain doping region of a field effect transistor.

* * * * *